(12) United States Patent
Kubo

(10) Patent No.: US 7,443,643 B2
(45) Date of Patent: Oct. 28, 2008

(54) INVERTER DEVICE FOR AUTOMOBILE

(75) Inventor: Mamoru Kubo, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/130,084

(22) Filed: May 17, 2005

(65) Prior Publication Data

US 2005/0259370 A1 Nov. 24, 2005

(30) Foreign Application Priority Data

May 21, 2004 (JP) ............................. 2004-151674

(51) Int. Cl.
*H01R 31/02* (2006.01)
*H01R 31/08* (2006.01)

(52) U.S. Cl. ........................ 361/42; 324/509; 324/522
(58) Field of Classification Search .................. 361/42; 324/509, 510, 522
See application file for complete search history.

(56) References Cited

U.S. PATENT DOCUMENTS

| | | | | |
|---|---|---|---|---|
| 4,071,839 A | * | 1/1978 | Hollins | 123/41.15 |
| 5,595,064 A | * | 1/1997 | Ikeda et al. | 62/126 |
| 6,856,137 B2 | * | 2/2005 | Roden et al. | 324/509 |
| 6,970,807 B2 | * | 11/2005 | Kito et al. | 702/183 |
| 6,977,518 B2 | * | 12/2005 | Higashihama et al. | 324/771 |
| 2004/0130326 A1 | * | 7/2004 | Yamamoto | 324/503 |
| 2004/0212371 A1 | * | 10/2004 | Nomoto et al. | 324/522 |
| 2004/0227521 A1 | * | 11/2004 | Higashihama et al. | 324/522 |

FOREIGN PATENT DOCUMENTS

| | | |
|---|---|---|
| EP | 1 336 528 A2 | 8/2003 |
| JP | 2933490 B2 | 5/1999 |
| JP | 2004-289903 A | 10/2004 |

* cited by examiner

*Primary Examiner*—Michael J Sherry
*Assistant Examiner*—Zeev Kitov
(74) *Attorney, Agent, or Firm*—McDermott Will & Emery LLP

(57) ABSTRACT

An object is to provide an inverter device for an automobile capable of detecting a ground fault with simple circuitry, and in summary, the inverter device has an inverter (inverter module) which generates an AC output from a battery loaded on a vehicle body to drive a motor, and the inverter device comprises a ground fault detection circuit connected between a negative line of the battery and the vehicle body, and a controller, wherein the ground fault detection circuit includes a serial circuit of a resistor element and a condenser element or a serial circuit of a plurality of resistor elements, and a potential at a connection point of the elements is input to the controller to detect a ground fault.

3 Claims, 5 Drawing Sheets

INVERTER DEVICE FOR AUTOMOBILE

BACKGROUND OF THE INVENTION

1. Field of the Invention

The present invention relates to an inverter device for an automobile which generates an AC output from a battery loaded on a vehicle body to drive a motor.

2. Description of the Related Art

Recently, an air conditioner equipped with an electrically driven compressor driven by a battery power source has been developed as an air conditioner for an electric automobile. This air conditioner comprises a battery (DC power source), an inverter device and an electrically driven compressor.

The above-mentioned inverter device comprises a switch as a switching device connected in serial to the battery; a charging device connected in parallel to this switch and including a resistor and a switch; an inverter module configured by molding, into a mold package, a switching element group including a switching element and an unshown diode to absorb a switching surge; a condenser; etc. The switching element group of the inverter module converts a DC voltage from the battery into a three-phase AC voltage, and applies it to the electrically driven compressor to drive a motor of the electrically driven compressor.

The above-mentioned condenser stably supplies a voltage to the switching element group. The resistor of the charging device restricts an incoming current through the condenser and an incoming current generated in the condenser when the DC voltage of the battery is applied. That is, the presence of the resistor makes it possible to, when the battery is connected, open the switch, close the switch of the charging device, and pass a current via the resistor, thereby restricting the incoming current produced when the voltage of the battery is applied. This makes it possible to prevent such a disadvantage that a high current or a high voltage is applied to the inverter module to damage the switching element group and the like in the inverter module.

In such an inverter device, a ground fault might occur, for example, in a positive line and a negative line of the battery, or inside the motor of the electrically driven compressor. Especially when the ground fault has occurred in the negative line, a leak current does not run despite the ground fault because a high voltage side is usually insulated, which has not allowed the ground fault to be detected. Thus, if the ground fault is left as it is without being noticed and if a further ground fault occurs at another place, a leak current might run to result in an electric shock, or a fire or damage of equipment due to the current.

Furthermore, means to detect such a ground fault has also been developed which is provided with an oscillating circuit to form a predetermined pulse waveform, and a ground fault detection circuit including a detection circuit to detect the pulse waveform from the oscillating circuit, thereby detecting the occurrence of the ground fault from a change in the pulse waveform of the oscillating circuit (e.g., refer to Japanese Patent Publication Laid-open No. 2933490).

However, when the ground fault detection circuit as mentioned above is provided, the circuit to detect the ground fault is complicated, leading to a problem of an increased production cost.

SUMMARY OF THE INVENTION

The present invention has been attained to solve the foregoing problem of prior art, and it is an object of the present invention to provide an inverter device for an automobile capable of detecting a ground fault with simple circuitry.

That is, an inverter device for an automobile of the present invention has an inverter which generates an AC output from a battery loaded on a vehicle body to drive a motor, and the inverter device comprises a ground fault detection circuit connected between a negative line of the battery and the vehicle body, and a controller, wherein the ground fault detection circuit includes a serial circuit of a resistor element and a condenser element or a serial circuit of a plurality of resistor elements, and a potential at a connection point of the elements is input to the controller to detect a ground fault.

Furthermore, in the inverter device for the automobile of the present invention, the controller, in the invention described above, judges that that a ground fault has occurred in the negative line of the battery when the input potential has decreased.

Still further, in the inverter device for the automobile of the present invention, the controller, in the invention described above, judges that a ground fault has occurred in a positive line of the battery or in an output of the inverter when the input potential has increased.

According to an inverter device for an automobile of the present invention, the inverter device has an inverter which generates an AC output from a battery loaded on a vehicle body to drive a motor, and the inverter device comprises a ground fault detection circuit connected between a negative line of the battery and the vehicle body, and a controller, wherein the ground fault detection circuit includes a serial circuit of a resistor element and a condenser element or a serial circuit of a plurality of resistor elements, and a potential at a connection point of the elements is input to the controller to detect a ground fault, whereby, for example, when a ground fault has occurred in the negative line of the battery, a value of a current running to the ground fault detection circuit decreases, and the potential at the connection point of the elements decreases. Thus, when the input potential of the controller has decreased, it is judged that a ground fault has occurred in the negative line of the battery, so that it is possible to accurately detect the ground fault in the negative line of the battery.

Furthermore, for example, when a ground fault has occurred in the positive line of the battery or in an output of the inverter, the value of the current running to the ground fault detection circuit increases, so that the potential at the connection point of the elements decreases. Thus, when the input potential of the controller has increased, it is judged that a ground fault has occurred in the positive line of the battery or in the output of the inverter, so that it is possible to detect the ground fault in the positive line of the battery and the ground fault in the output of the inverter.

In this way, such simple circuitry makes it possible to detect the occurrence of the ground fault in each section of the inverter device, thereby also allowing production cost to be reduced as low as possible.

DETAILED DESCRIPTION OF THE PREFERRED EMBODIMENT

Embodiments of the present invention will be described below in detail with reference to the drawings.

Embodiment 1

Figure 1:
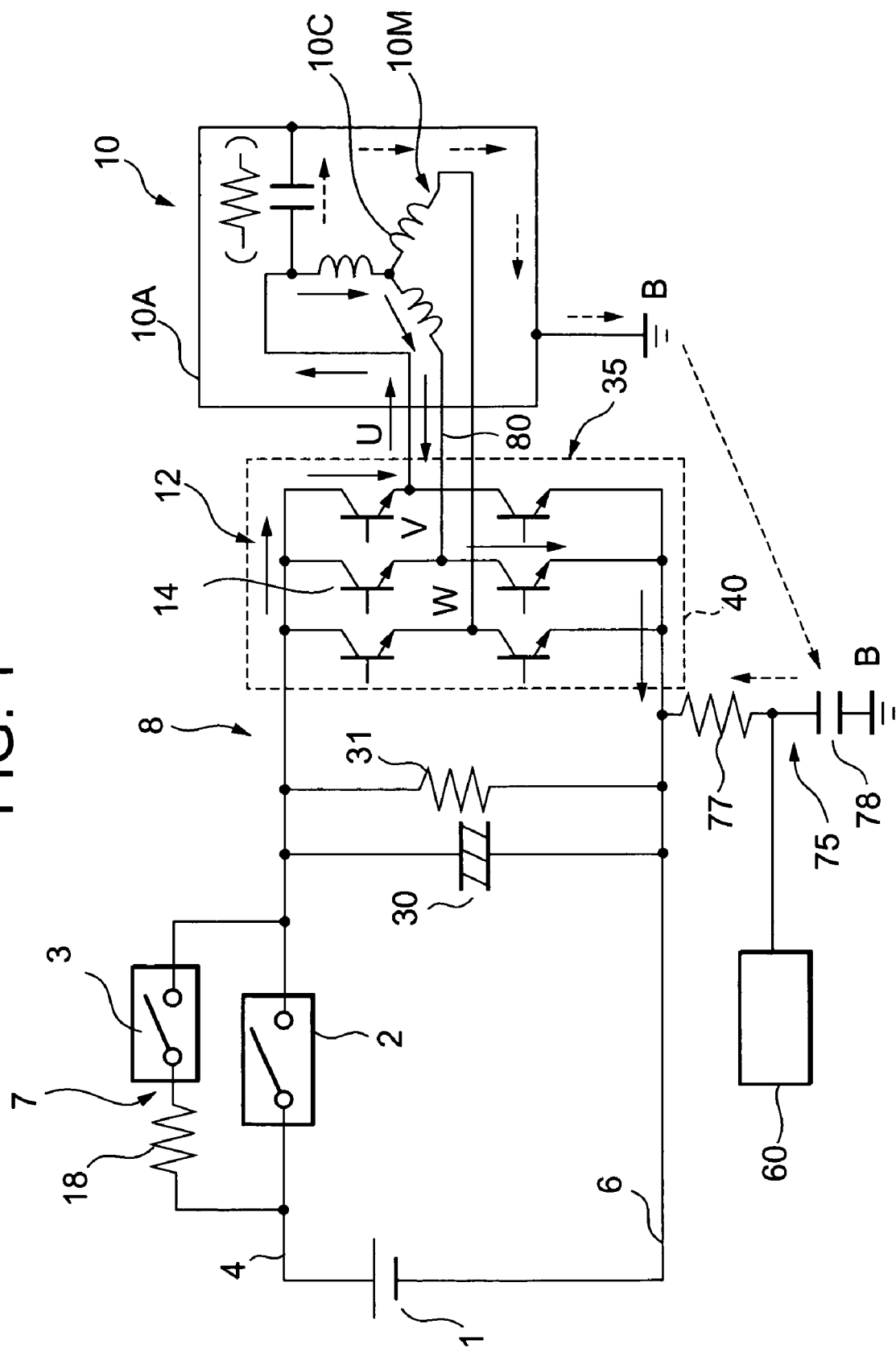
FIG. 1 is an electric circuit diagram of one embodiment of an air conditioner for an electric automobile Comprising an inverter device of the present invention.

FIG. 1 is a power source circuit diagram of one embodiment of an air conditioner for an electric automobile comprising an inverter device 8 of the present invention. In FIG. 1, 1 is a main battery as a DC power source of the electric automobile, and this provides power to an electrically driven compressor 10 of the air conditioner via the inverter device 8 of the present invention.

The above-mentioned inverter device 8 comprises a switch 2 as a switching device, a charging circuit 7 as a charging device, a condenser 30, a discharging resistor 31, the inverter module 35 (inverter), and the like.

The above-mentioned inverter module 35 comprises a switching element group 12 provided in a mold package 40 to convert the voltage into the three-phase AC voltage by switching. This switching element group 12 comprises a switching element 14 and an unshown diode to absorb a switching surge, and is connected between a positive line 4 (e.g., about DC +350 V) and a negative line 6 of the battery 1.

Furthermore, a DC voltage is output from the battery 1, but a voltage converted into a three-phase AC is supplied to a stator coil 10C (three phase) of a motor 10M of the electrically driven compressor 10 by the inverter module 35 of the inverter device 8 described later. That is, the voltage is switched by the switching element group 12 of the inverter module 35, so that the three-phase AC is supplied to a U phase, V phase, W phase of the stator coil 10C via an UVW harness 80 (an output of the inverter).

Furthermore, the switch 2 is connected to the positive line 4 between the battery 1 and the switching element group 12. The condenser 30 stably supplies a voltage to the switching element group 12, and is connected between the positive line 4 that is between the switch 2 and the switching element group 12, and the negative line 6. The condenser 30 is charged from the battery 1 via the charging circuit 7 described later. Further, the discharging resistor 31 discharges the charged condenser 30, and is connected between the positive line 4 that is between the condenser 30 and the switching element group 12, and the negative line 6.

The above-mentioned charging circuit 7 comprises a serial circuit of a switch 3 and a positive characteristic thermister 18, and is connected in parallel to the switch 2. This charging circuit 7 restricts an incoming current through the condenser 30 when the voltage of the battery 1 is applied.

Then, a controller 60 of the inverter device 8, in accordance with an operation command from an unshown controller of the air conditioner, first closes the switch 3 while the switch 2 is open (open-up), and passes a current from the battery 1 to the condenser 30 via the positive characteristic thermister 18, thus charging the condenser 30. The positive characteristic thermister 18 heats by itself to increase a resistance value, and thus serves to restrict an increase in a value of a flowing current. This restricts the incoming current and protects the condenser 30 and the switching element group 12.

Next, the controller 60 closes the switch 2 at the moment when the charging of the condenser 30 is completed, and then opens the switch 3 of the charging circuit 7, and after this, the voltage of the battery 1 is applied to the switching element group 12 via the switch 2. The controller 60 controls the turning on/off of the switching element 14 of the switching element group 12 to generate a three-phase AC voltage at a predetermined frequency, and, as described above, applies it to the stator coil 10C of the motor 10M of the electrically driven compressor 10 to drive the same.

Then, in accordance with an operation specifying instruction from the controller of the air conditioner, the controller 60 opens (opens up) the switch 2, and stops the operation of the electrically driven compressor 10.

In addition, an airtight container 10A of the electrically driven compressor 10 is grounded to a vehicle body B, and the stator coil 10C and the like inside are electrically insulated from the airtight container 10A.

Here, a ground fault detection circuit 75 of the present invention will be described. The ground fault detection circuit 75 is connected between the negative line 6 of the battery 1 and the vehicle body B, and comprises a serial circuit of a resistor element 77 on the negative line 6 side and a condenser element 78 on the vehicle body B side. Further, a potential at a connection point of the resistor element 77 and the condenser element 78 is input to the controller 60.

It is to be noted that a plurality of unshown pins is attached to the mold package 40 to connect the switching element group 12 in the mold package 40 with the battery 1, the switch 2, the electrically driven compressor 10 and the like outside the mold package 40. These pins allow the devices inside and outside the mold package 40 to be connected without trouble.

With the configuration described above, the operation of the ground fault detection circuit 75 will be described. Here, even in a normal state where no ground fault has occurred, a leak current is running from the stator coil 10C of the motor 10M to the vehicle body B via the airtight container 10A through a refrigerant (indicated by a sign of a condenser or a resistor in the airtight container 10A in FIG. 1) or the like within the airtight container 10A. That is, a leak current at a frequency switched by the switching element group 12 runs to the airtight container 10A, the vehicle body B, the condenser element 78 and the resistor element 77 of the ground fault detection circuit 75, and the negative line 6 of the battery 1 as indicated by a broken-line arrow in FIG. 1, so that a certain potential appears at the connection point of the condenser element 78 and the resistor element 77. That is, a potential V0 at the connection point of the condenser element 78 and the resistor element 77 is input to the controller 60 even in the normal state.

Figure 2:
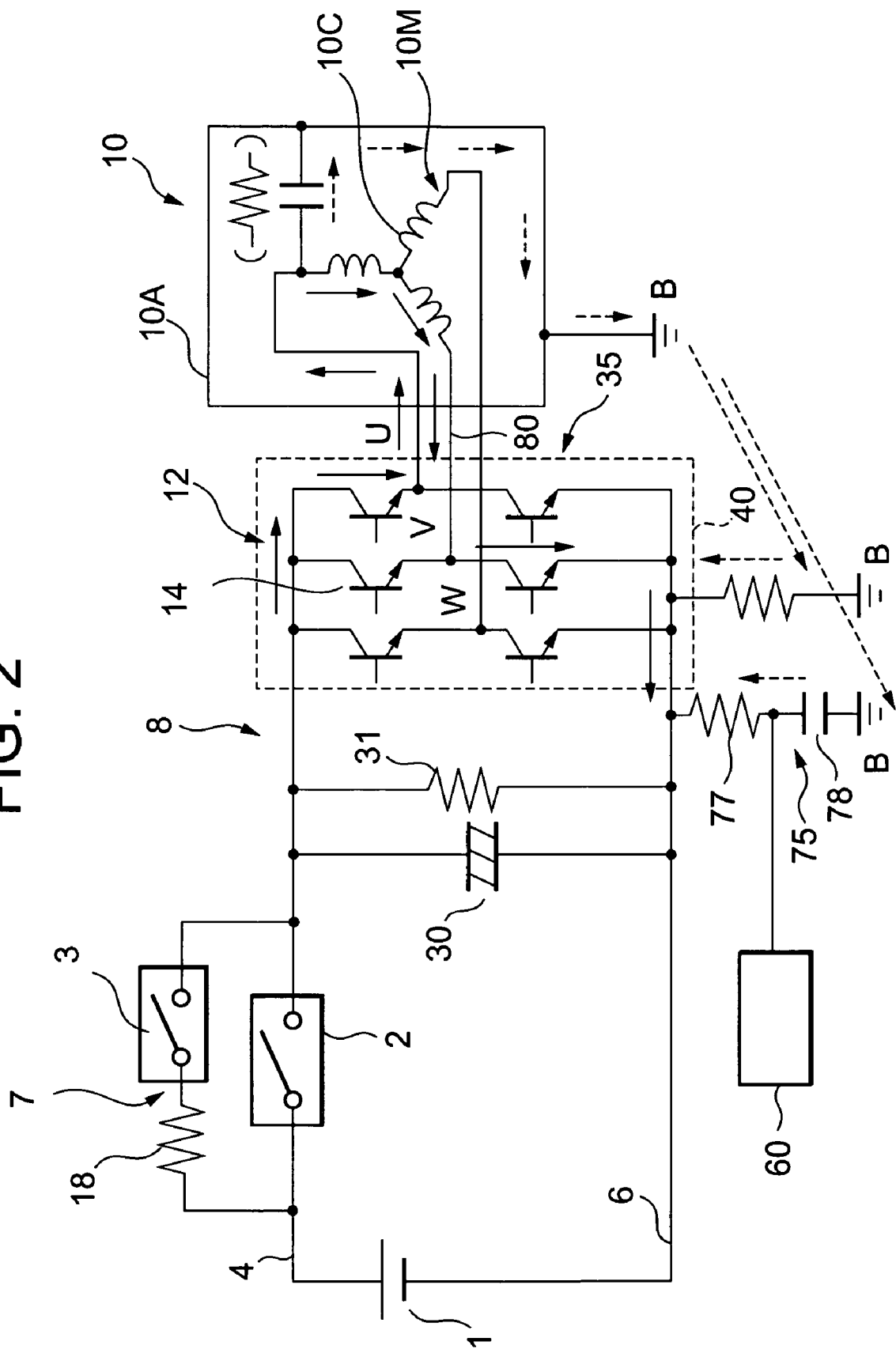
FIG. 2 is a diagram showing the flow of a current when a ground fault has occurred in a negative line of the inverter device of FIG. 1.

Here, when a ground fault has occurred between the negative line 6 and the vehicle body B as shown in FIG. 2, the leak current from the motor 10M of the electrically driven compressor 10 described above runs from the part where the ground fault has occurred to the negative line 6. Thus, there is little current running to the ground fault detection circuit 75, and the potential of the connection point input to the controller 60 will decrease or will be zero. When, for example, the potential input to the controller 60 has decreased below predetermined upper and lower ranges of the V0, the controller 60 judges that a ground fault has occurred in the negative line 6, and issues a predetermined warning.

Figure 3:
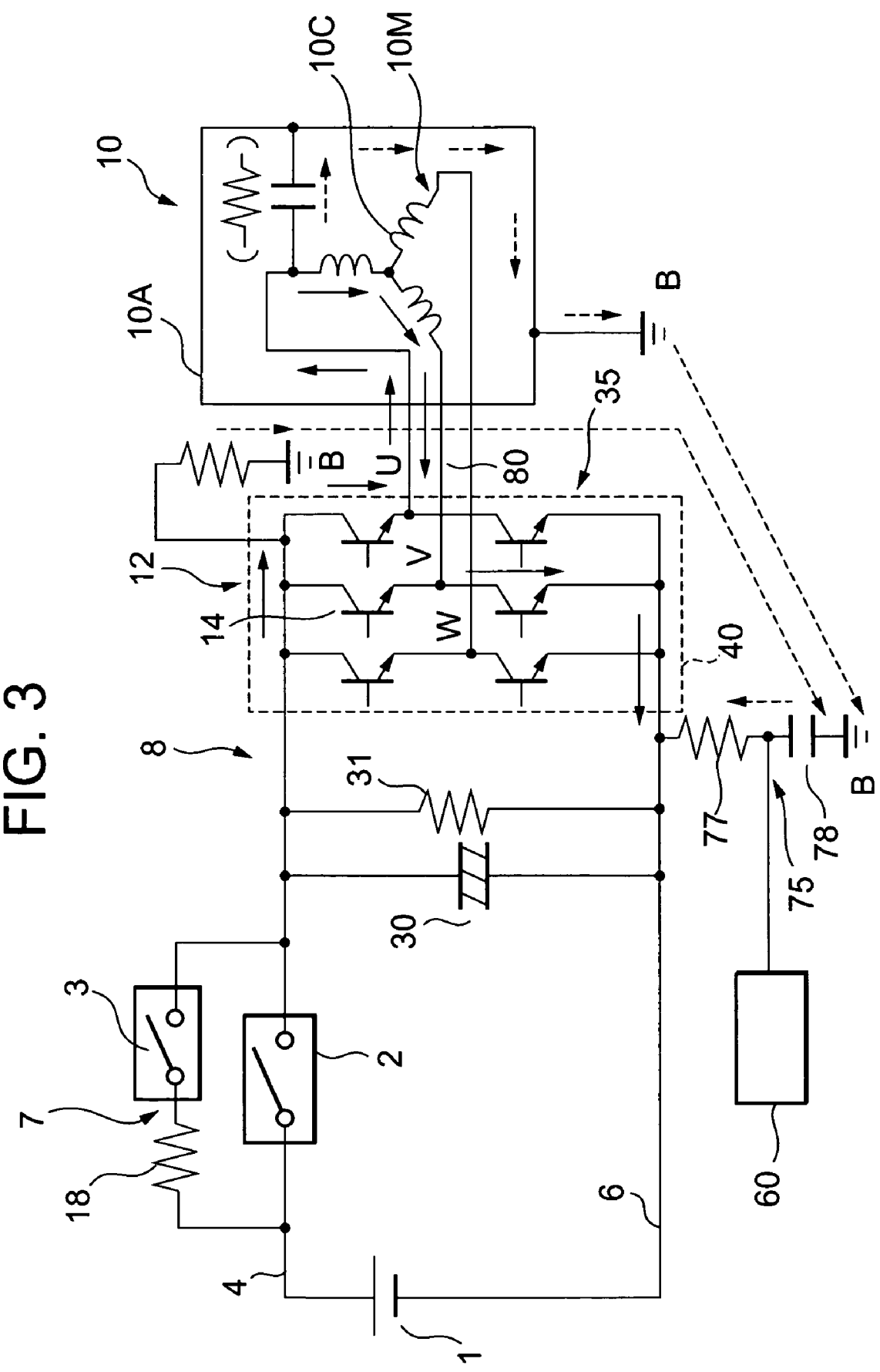
FIG. 3 is a diagram showing the flow of the current when a ground fault has occurred in a positive line of the inverter device of FIG. 1.

On one hand, if a ground fault has occurred between the positive line 4 and the vehicle body B, a ground-fault current is added to the leak current from the motor 10M of the electrically driven compressor 10. That is, as shown in FIG. 3, in addition to the leak current from the motor 10M of the electrically driven compressor 10, a current also leaks from the part where the ground fault has occurred and runs to the ground fault detection circuit 75. Consequently, the current running to the ground fault detection circuit 75 increases, and the potential of the connection point input to the controller 60 will increase.

Figure 4:
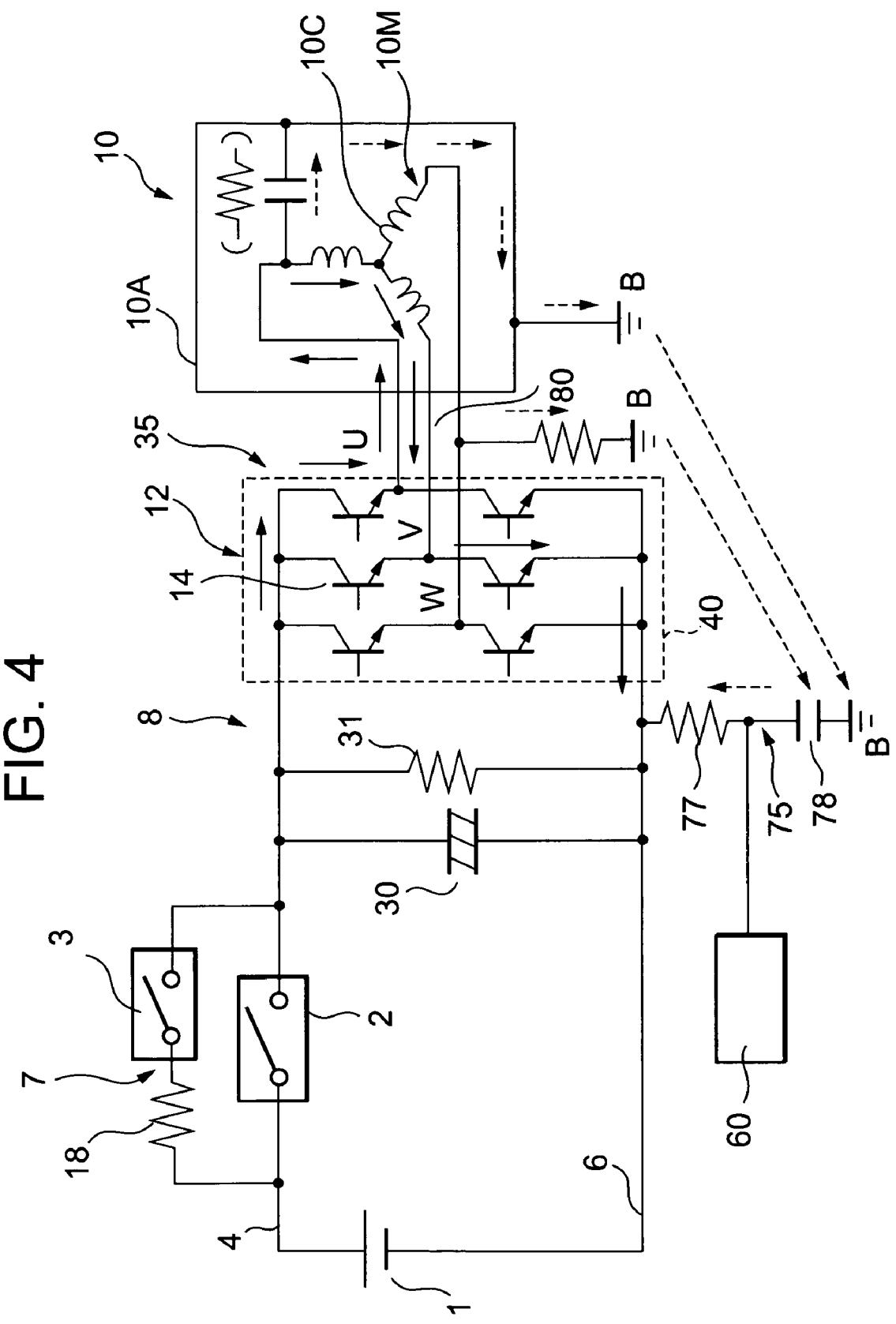
FIG. 4 is a diagram showing the flow of a current when a ground fault has occurred in an UVW harness of the inverter device of FIG. 1.

On the other hand, when a ground fault has occurred in the UVW harness 80 which is the output of the inverter module (inverter), the ground-fault current is also added to the leak current from the motor 10M of the electrically driven compressor 10. That is, as shown in FIG. 4, in addition to the leak current from the motor 10M of the electrically driven compressor 10, a current also leaks from the part of the UVW harness 80 where the ground fault has occurred and runs to the ground fault detection circuit 75. Consequently, as in the case described above where the ground fault has occurred between the positive line 4 and the vehicle body B, the current running to the ground fault detection circuit 75 increases, and the potential of the connection point input to the controller 60 will increase. Therefore, when the potential input to the controller 60 has increased beyond the predetermined upper and lower ranges of the V0, the controller 60 judges that a ground fault has occurred in the positive line 4 or in the UVW harness 80, and issues a predetermined warning.

In this way, when the potential has increased beyond the potential within the predetermined ranges resulting from the leak current running in the normal state, the controller 60 judges that a ground fault has occurred in the positive line 4 or in the UVW harness 80, and when the input potential has decreased below the predetermined ranges, the controller 60 judges that a ground fault has occurred in the negative line 6, thereby making it possible to detect the occurrence of the ground fault in the inverter device 8 and in the UVW harness 80 which is the output of the inverter.

In particular, the ground fault detection circuit of the present invention also allows the detection of the ground fault in the negative line 6 of the battery 1 occurrence of which has heretofore been difficult to detect, so that the safety and reliability of the inverter device 8 can be improved.

Furthermore, since the ground fault detection circuit 75 of the present invention comprises a simple structure of the serial circuit of the resistor element 77 and the condenser element 78, the increase of costs due to the provision of the ground fault detection circuit 75 can be reduced as low as possible.

Embodiment 2

Figure 5:
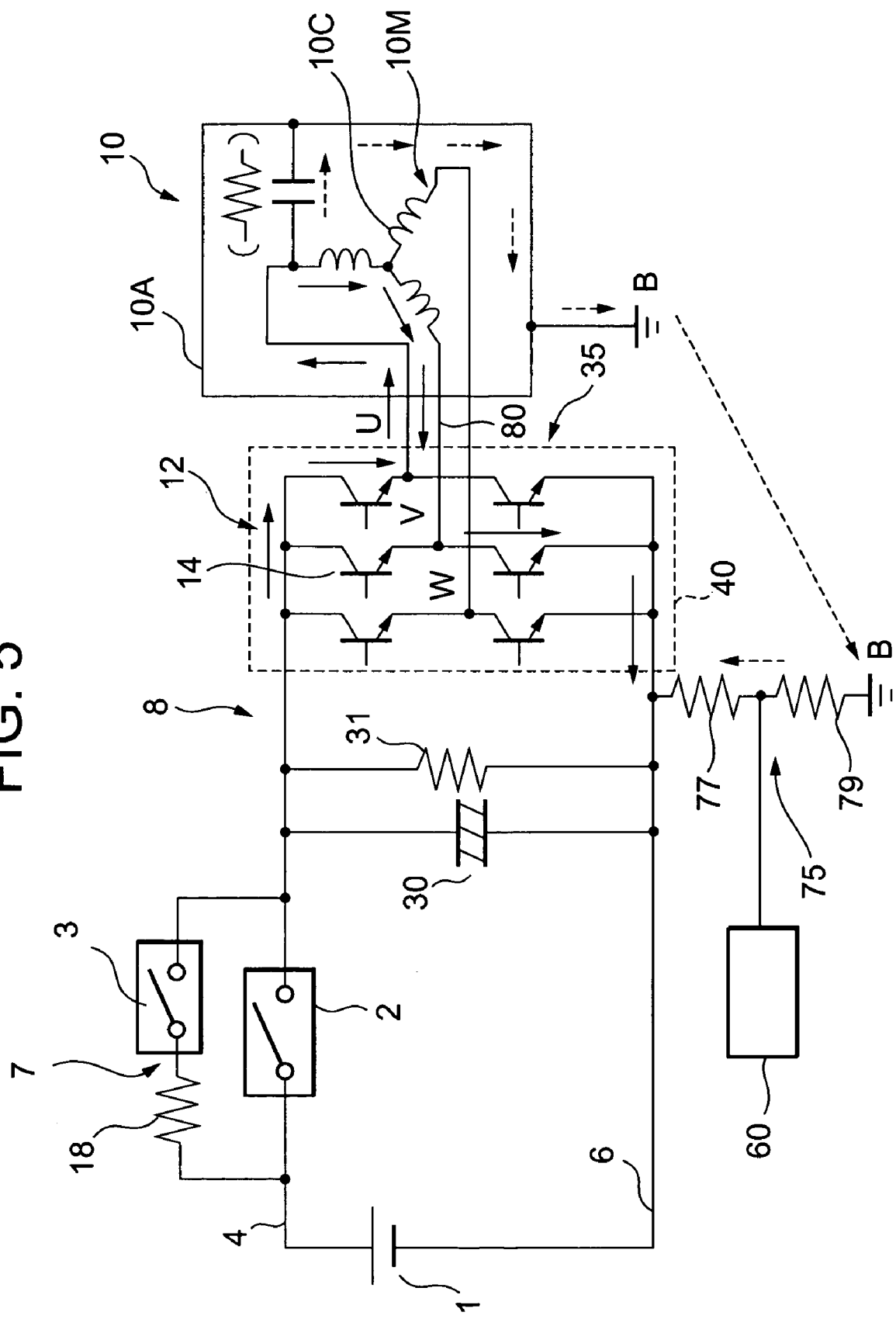
FIG. 5 is an electric circuit diagram of another embodiment of the air conditioner for the electric automobile comprising the inverter device of the present invention.

In addition, the ground fault detection circuit 75 comprises the serial circuit of the resistor element 77 and the condenser element 78 in the embodiment described above, but, for example, as shown in FIG. 5, it may also comprise a serial circuit of a plurality of resistor elements (in FIG. 5, two resistor elements 77, 79). In this case, the resistor element 79 on the vehicle body B side used has a sufficiently large resistance value.

What is claimed is:

1. An inverter device for an automobile comprising:
    an inverter for generating an AC output from a battery loaded on a vehicle body to drive a motor;
    a ground fault detection circuit connected between a negative line of the battery and the vehicle body; and
    a controller,
    wherein the ground fault detection circuit includes a serial circuit of a resistor element and a condenser element or a serial circuit of a plurality of resistor elements, and when the motor is driven and minute leak current flows from the motor to the ground fault detection circuit, the ground fault detection circuit detects a ground fault based on the change of the value of the leak current.

2. The inverter device for the automobile according to claim 1, wherein the controller judges that a ground fault has occurred in the negative line of the battery when the leak current flowing the ground fault detection circuit has decreased.

3. The inverter device for the automobile according to claim 1 or claim 2, wherein the controller judges that a ground fault has occurred in a positive line of the battery or in an output of the inverter when the leak current flowing the ground fault detection circuit has increased.

* * * * *